United States Patent
Chu

(10) Patent No.: US 10,294,037 B1
(45) Date of Patent: May 21, 2019

(54) CARRIER MONITORING SYSTEM AND METHOD THEREOF

(71) Applicants: Inventec (Pudong) Technology Corporation, Shanghai (CN); Inventec Corporation, Taipei (TW)

(72) Inventor: Tao Chu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/009,907

(22) Filed: Jun. 15, 2018

(30) Foreign Application Priority Data

Mar. 27, 2018 (CN) .......................... 2018 1 0259176

(51) Int. Cl.
*B65G 43/00* (2006.01)
*G06F 17/30* (2006.01)
*G06F 16/22* (2019.01)

(52) U.S. Cl.
CPC ............. *B65G 43/00* (2013.01); *G06F 16/22* (2019.01); *G06F 17/30312* (2013.01); *B65G 2203/0283* (2013.01); *B65G 2203/044* (2013.01)

(58) Field of Classification Search
None
See application file for complete search history.

(56) References Cited

U.S. PATENT DOCUMENTS

| | | | | |
|---|---|---|---|---|
| 2,043,293 A * | 6/1936 | Jennings | ............ | G06K 7/10861 406/4 |
| 3,238,515 A * | 3/1966 | Schrader | ................. | B61L 25/04 360/110 |
| 4,829,445 A * | 5/1989 | Burney | ............... | G05B 19/4183 198/349 |
| 5,168,477 A * | 12/1992 | Schenato | .............. | E21B 17/006 367/87 |
| 5,351,801 A * | 10/1994 | Markin | .................. | B65G 37/02 198/346.1 |
| 6,616,041 B1 * | 9/2003 | Corby, Jr. | ............... | G06K 1/126 235/462.01 |
| 6,782,750 B1 * | 8/2004 | Melandso | ................ | G06K 7/02 73/579 |
| 6,843,357 B2 * | 1/2005 | Bybee | ...................... | B25J 18/04 198/345.3 |

(Continued)

*Primary Examiner* — William R Harp
(74) *Attorney, Agent, or Firm* — David R. Stevens; Stevens Law Group

(57) ABSTRACT

A carrier monitoring system and a method thereof are disclosed. The carrier monitoring system includes carriers for carrying and positioning at least one circuit board, and a reflow oven including a conveyor, a processing module and a database. When one of the carriers is placed on the conveyor, some sensing units are pressed by a plurality of bumps disposed on a bottom of the carrier, and each of the pressed sensing units transmits a sensing signal to the processing module. According to the sensing signals, the processing module obtains a carrier code; and, according to a plurality of identification codes stored in the database and the carrier code, the processing module can determine which carrier is placed on the conveyor. As a result, the technical effect of monitoring the carrier entering the reflow oven can be achieved.

10 Claims, 5 Drawing Sheets

(56) References Cited

U.S. PATENT DOCUMENTS

| | | | | |
|---|---|---|---|---|
| 7,243,002 B1* | 7/2007 | Hoganson | ............ | B65G 51/44 |
| | | | | 700/215 |
| 9,684,006 B2* | 6/2017 | Pollack | ................ | G01N 35/04 |
| 2018/0203435 A1* | 7/2018 | Mersnik | ............ | G05B 19/4183 |

* cited by examiner

CARRIER MONITORING SYSTEM AND METHOD THEREOF

CROSS-REFERENCE TO RELATED APPLICATION

This application claims the benefit of Chinese Patent Application No. 201810259176.7, filed Mar. 27, 2018.

BACKGROUND OF THE INVENTION

Field of the Invention

The present invention relates to a monitoring system and a method thereof, more particularly to a carrier monitoring system and a method thereof.

Description of the Related Art

In application field of surface mount technology (SMT), a reflow oven is an indispensable device providing heating environment to melt solder paste, so that the SMT components and the circuit board are stably combined by the melted solder paste.

In recent years, the thickness of the circuit board becomes thinner and thinner, so a carrier is required to position and support the circuit board during the reflow process within the reflow oven, thereby reducing deformation of the circuit board due to the high temperature of the reflow process and preventing the SMT component disposed on the circuit board from falling because of its excessive weight. The conventional carrier of the reflow oven mainly includes a frame and a carrier board. The frame is fixed and connected around the carrier board. The carrier board is provided with a circuit board placement groove having holes. The circuit board can be placed in the circuit board placement groove of the carrier board, and be fixed by fixing members provided around the frame. However, there is a problem that it is hard to monitor the carrier entering the reflow oven.

SUMMARY OF THE INVENTION

In order to solve conventional problem, the present invention is to provide a carrier monitoring system and a method thereof.

According to an embodiment, the present invention provides a carrier monitoring system comprising a plurality of carriers and a reflow oven. Each carrier is configured to carry and position at least one circuit board, and comprises a plurality of bumps disposed on a bottom thereof for identification of different carriers. The reflow oven comprises a conveyor, a processing module and a database; and there is a plurality of sensing units disposed on the conveyor in an array arrangement, the database stores a plurality of identification codes for identification of the different carriers. When one of the carriers is placed on the conveyor, some of the sensing units on the conveyor are pressed by the plurality of bumps of the carrier, and each of the pressed sensing units transmits a sensing signal to the processing module. According to the sensing signals, the processing module can obtain a carrier code; and, according to the plurality of identification code stored in the database and the carrier code, the processing module can determine which carrier is placed on the conveyor, and further monitor the carrier.

According to an embodiment, the present invention provides a carrier monitoring method, and the method comprises steps of: providing a plurality of carriers and a reflow oven, wherein each of the plurality of carriers comprises a plurality of bumps disposed on a bottom thereof for identification of the different carriers, and the reflow oven comprises a conveyor, a processing module and a database; and there is a plurality of sensing units disposed on the conveyor in an array arrangement, the database stores a plurality of identification codes for identification different carriers; carrying and positioning at least one circuit board by each of the plurality of carriers; when one of the plurality of carriers is placed on the conveyor, some of the plurality of sensing units on the conveyor are pressed by the plurality of bumps on the bottom of the one of the plurality of carriers, and each of the pressed sensing unit transmits a sensing signal to the processing module; according to the sensing signals, the processing module obtains a carrier code; and according to the plurality of identification codes stored in the database and the carrier code, the processing module determines which carrier is placed on the conveyor; and further monitor the carrier placed on the conveyor.

According to above content, the difference between the system and method of the present invention and the conventional technology is that, in the system and method of the present invention, when a carrier is placed on the conveyor, the bumps disposed on the bottom of the carrier can press a part of the sensing units on the conveyor, and each of the pressed sensing units transmits a sensing signal to the processing module, and according to the sensing signals, the processing module can obtain the carrier code; and, according to the plurality of identification codes stored in the database and the carrier code, the processing module can determine which carrier is placed on the conveyor.

By using aforementioned technical means, the system and method of the present invention can monitor the carrier entering the reflow oven, so as to achieve the effect of monitoring whether the carrier entering the reflow oven is moved out of the reflow oven normally, and facilitate to compute the period where the carrier stays within the reflow oven.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
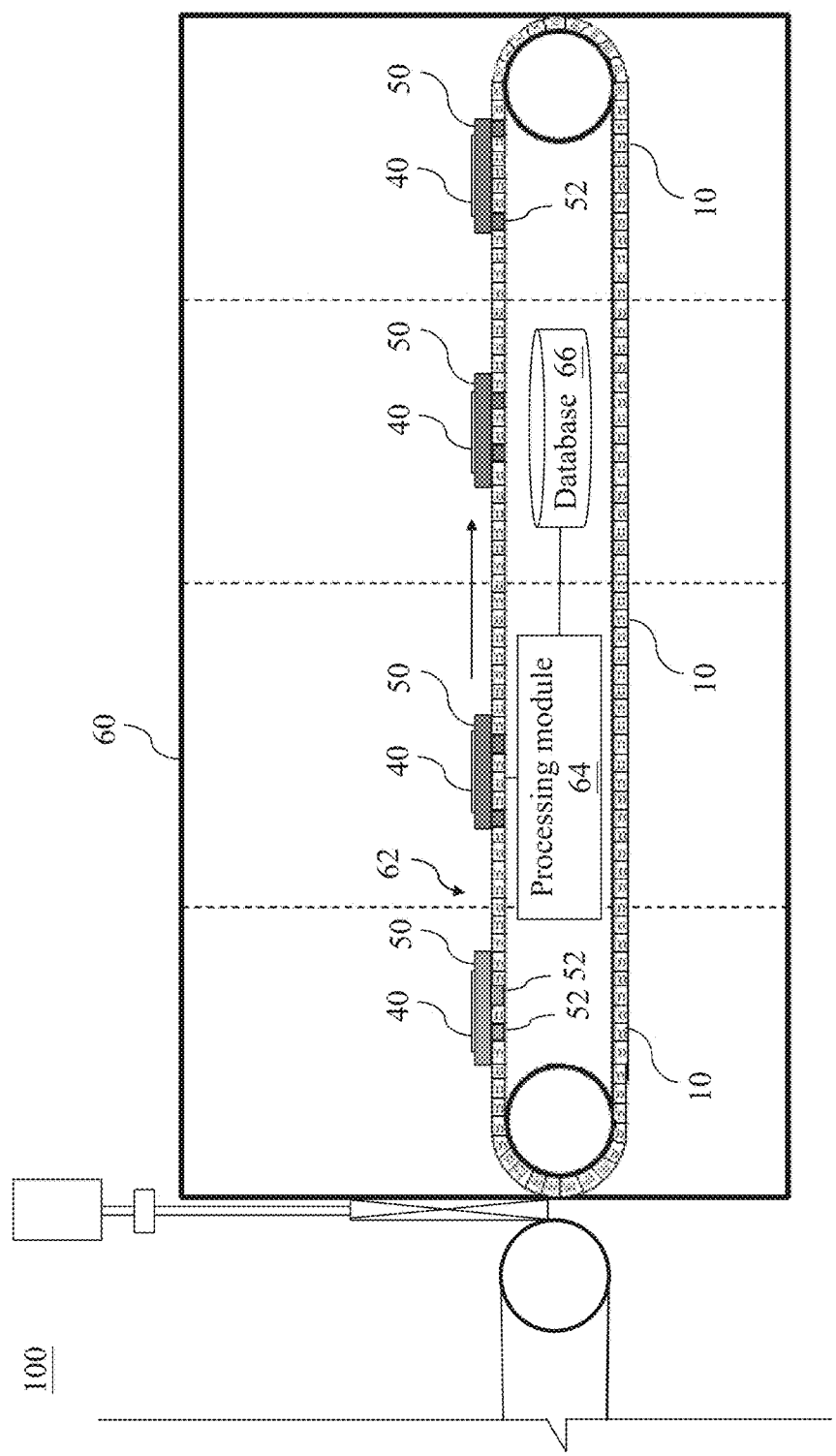
FIG. 1 is a schematic view of a carrier monitoring system of an embodiment of the present invention.

The following embodiments of the present disclosure are herein described in detail with reference to the accompanying drawings. These drawings show specific examples of the embodiments of the present disclosure. It is to be understood that these embodiments are exemplary implementations and are not to be construed as limiting the scope of the present disclosure in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

The terms defined in the present invention are illustrated before description of the carrier monitoring system and the method thereof of the present invention. The processing module included in the carrier monitoring system of the present invention can be implemented by various manners comprising software, hardware, firmware or a combination thereof. The software or the firmware used in an embodiment of the present invention can be stored in machine readable storage media, such as ROM memory, RAM memory, magnetic disk storage media, optical storage media, flash memory device and so on, and can be executed by at least one general-purpose or dedicated programmable microprocessor. In an embodiment, a plurality of bumps disposed on a bottom of a carrier, an identification code and a carrier code are used to identify different carriers; and, the identification code and the carrier code are the same in nature, and only one difference between the identification code and the carrier code is that the identification code is stored in the database; and the carrier code is obtained by the processing module after the processing module codes the sensing signals transmitted from the pressed sensing units; and, when the carrier code is stored to the database, the carrier code is also defined as the identification code.

The operations of the carrier monitoring system and the method thereof of the present invention will hereinafter be described in more detail, with reference to the accompanying drawings. Please refer to FIG. 1, which is a schematic view of a carrier monitoring system of an embodiment of the present invention. The carrier monitoring system 100 comprises a plurality of carriers 50 and a reflow oven 60. In this embodiment, a number of the carrier 50 can be four, but the present invention is not limited thereto; in actual application, the quantity of the carrier can be adjusted upon practical demand. The material of each of the plurality of carriers 50 can be aluminum alloy, magnesium alloy, synthetic stone fiber or glass fiber, and the user can adjust the material upon demand. It should be noted that the reflow soldering process executed in the reflow oven 60 and the processing machines disposed in the reflow oven 60 are well known for the persons skilled in the art, so their detailed descriptions are not repeated; and, for the convenience of representation, the processing machines disposed in the reflow oven 60 are not drawn.

Each carrier 50 is configured to carry and position at least one circuit board 40, and comprises a plurality of bump 52 disposed on a bottom thereof and configured to identify different carriers 50. Please refer to FIGS. 2A, 2B and 2C. FIG. 2A is a structural bottom view of the carrier of FIG. 1 of an embodiment, FIG. 2B is a schematic cross-sectional view of the carrier of FIG. 2A taken along a line BB, FIG. 2C is a schematic cross-sectional view of the carrier of FIG. 2A carrying and positioning at least one circuit board, according to an embodiment of the present invention. Each carrier 50 comprises a circuit board placement groove 54 having holes 51 and a positioning structure (not shown in figures). The circuit board 40 can be placed in the circuit board placement groove 54, the positioning structure can be used to fix the circuit board 40 placed on the circuit board placement groove 54. The plurality of holes 51 are formed correspondingly in position to the components soldered on the circuit board 40, such as the black blocks shown in FIG. 2C. The white blocks shown in FIG. 2C are the components to be soldered. Furthermore, each of the plurality of carrier 50 comprises a plurality of bumps 52 disposed on a bottom thereof and configured to identify the different carriers 50. The bump 52 can be, but not limited to, a square bump, a circular bump, a triangular bump or a bump in any shape. The number of the bumps 52 and relative positions between the bumps 52 can be designed for identification of the different carriers 50. In this embodiment, the plurality of bumps 52 can be square bumps and each carrier 50 comprises three bumps 52 disposed on the bottom thereof; however, the present invention is not limited thereto, the number of the bumps 52 can be adjusted upon practical demand.

In this embodiment, when the carrier 50 is a full-process carrier for the reflow oven 60, the carrier 50 can be designed in consideration of the condition required for tin paste printing process, and a printed surface 42 of the at least one circuit board 40 must be higher than the highest surface of the carrier 50 when the carrier 50 carries and positions the at least one circuit board 40, that is, the printed surface 42 of the at least one circuit board 40 is higher than all surfaces of the carrier 50 corresponding thereto, thereby preventing from occurrence of error during the tin paste printing process. In this embodiment, the tin paste is printed on the printed surface 42; however, the present invention is not limited thereto. For example, when the carrier 50 is just a reflow carrier of the reflow oven 60, that is, the carrier 50 is used only for passing the furnace of the reflow oven 60, it is not necessary to design the carrier 50 with the highest surface lower than the printed surface 42 of the circuit board 40 when the circuit board 40 is placed on the carrier 50.

Figure 2A:
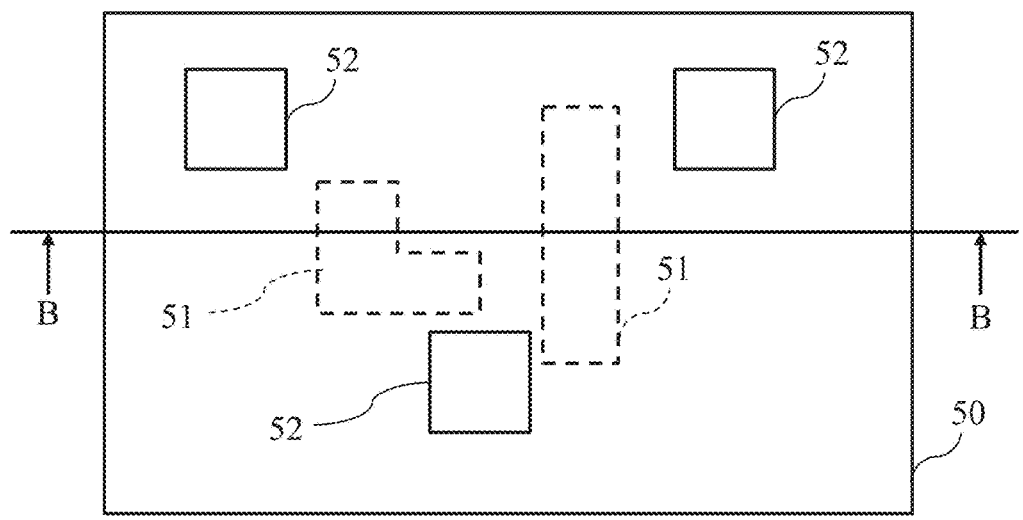
FIG. 2A is a bottom view of a structure of the carrier of FIG. 1 of an embodiment.
Figure 3A:
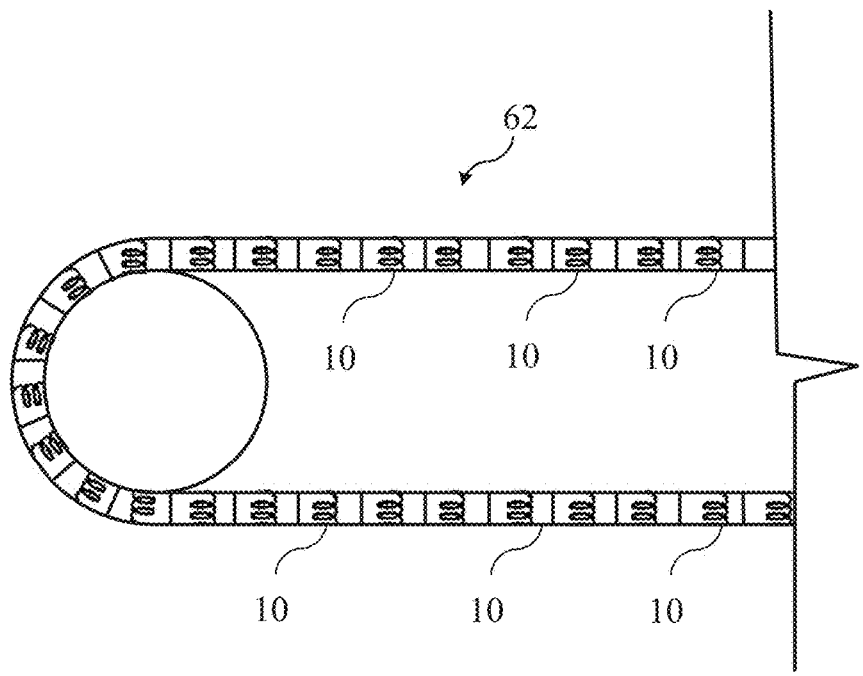
FIG. 3A is a schematic structural view of the conveyor of the reflow oven of FIG. 1, according to an embodiment of the present invention.
Figure 3B:
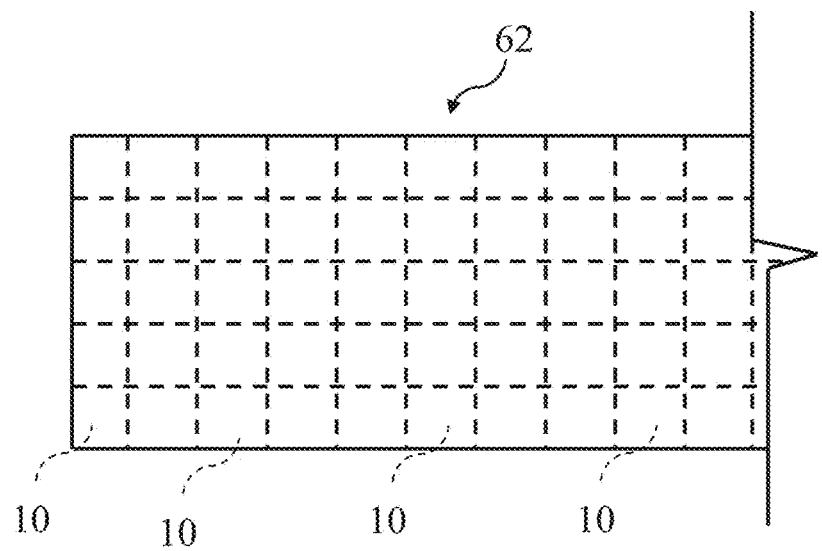
FIG. 3B is a top view of a structure of the conveyor of the reflow oven of FIG. 1, according to an embodiment of the present invention.
Figure 3C:
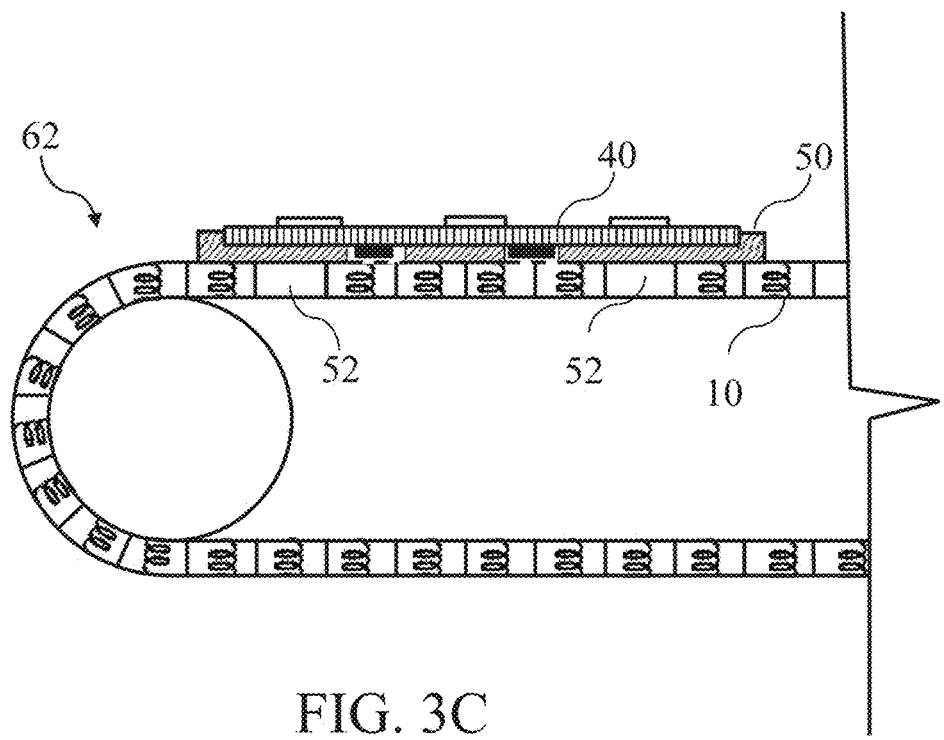
FIG. 3C is a schematic view of the carrier of FIG. 2A placed on the conveyor of the FIG. 3A, according to an embodiment of the present invention.

Please refer to FIG. 1, FIGS. 3A, 3B and 3C. FIG. 3A is a schematic structural view of the conveyor of the reflow oven of FIG. 1, according to an embodiment of the present invention. FIG. 3B is a top view of the structure of the conveyor of the reflow oven of FIG. 1, according to an embodiment of the present invention. FIG. 3C is a schematic view of the carrier of FIG. 2A placed on the conveyor of the FIG. 3A, according to an embodiment of the present invention. In this embodiment, the reflow oven 60 comprises a conveyor 62, a processing module 64 and a database 66. There is a plurality of sensing units 10 disposed on the conveyor 62 in an array arrangement, as shown in FIG. 3B, a dotted box is a sensing unit 10. The database 66 is configured to store a plurality of identification codes for identification of the different carriers 50. Preferably, the sensing unit 10 can be, but is not limited to, a sensing unit that changes the electric flux by the deformation caused by a spring with which it is pressed; however, the present invention is not limited to this example. For the convenience of representation, the sensing unit 10 is schematically shown by a spring in figures, but the present invention is not limited thereto.

When one of the plurality of carriers 50 is disposed on the conveyor 62, some of the sensing units 10 on the conveyor 62 are pressed by the plurality of bumps 52 of the one of the plurality of carriers 50, that is, some springs are forced to deform, so that each of the pressed sensing units 10 transmits a sensing signal to the processing module 64. According to the sensing signals, the processing module 64 can obtain a carrier code; and, according to the plurality of identification codes stored in the database 66 and the carrier code, the processing module 64 can determine which carrier 50 is placed on the conveyor 62. In greater detail, different carriers 50 comprise bumps 52 in different arrangement, so when different carrier 50 is placed on the conveyor 62, the number of the sensing units 10 on the conveyor 62 being pressed is different and the sensing units 10 on the conveyor 62 being pressed are also different, so the sensing units 10 transmitting the sensing signals are different and a number of the sensing signals received by the processing module 64 is also different. As a result, after the processing module 64 receives the sensing signals transmitted from the pressed sensing unit 10, the processing module 64 can obtain the carrier code corresponding to the carrier 50 placed on the conveyor 62, and the processing module 64 can search one of the identification code stored in the database 66 corresponding to the obtained carrier code, so as to determine whether the carrier 50 currently placed on the conveyor 62 has been placed on the conveyor 62. When the processing module 64 determines that the carrier 50 currently placed on the conveyor 62 has been placed on the conveyor 62, the carrier code obtained by the processing module 64 should be one of the identification code stored in the database 66. Each carrier 50 corresponds to a carrier code and an identification code only, so the processing module 64 can determine ID of the carrier 50, and the carrier monitoring system 100 can monitor the carrier 50, thereby achieving the effect of monitoring whether the carrier 50 entering the reflow oven 60 is moved out of the reflow oven 60 normally and facilitate to compute the period where the carrier 50 stays in the reflow 60. It should be noted that the bump 52 can press the spring fully, so in FIG. 3C the space where the spring is disposed is fully replaced by the bump 52, and the spring is the sensing unit 10.

Furthermore, an arrangement density of the plurality of sensing units 10 relates to the number of the carriers 50 to be monitored. When the number of the carriers 50 to be identified and monitored is more, the arrangement density of the plurality of sensing units 10 must be higher, so that the plurality of sensing units 10 can accurately output different sensing signals when being pressed by the bumps 52 of different carrier 50, and the processing module 64 can obtain more carrier codes, and then the carrier monitoring system 100 can monitor more carriers 50.

When the processing module 64 is unable to determine which carrier 50 is placed on the conveyor 62, it indicates that the carrier 50 currently placed on the conveyor 62 has never been placed on the conveyor 62, that is, the carrier 50 is placed on the conveyor 62 by the first time. For this reason, the processing module 64 can define the carrier code as a new identification code and store the new identification code in the database 66.

Furthermore, in this embodiment, when the processing module 64 is able to determine which carrier 50 is placed on the conveyor 62, the processing module 64 can record an accumulation times by which the carrier 50 is placed on the conveyor 62. Each carrier 50 may be made by different material and have different service life or usage frequency, so that the use condition of each carrier 50 can be monitored effectively according to the accumulation times recorded by the processing module 64. The carrier 50 can be replaced by a new carrier in time according to its usage frequency, so as to prevent the performance of reflow solder process on the circuit board 40 from being affected by the poor status of the carrier 50.

Figure 2B:
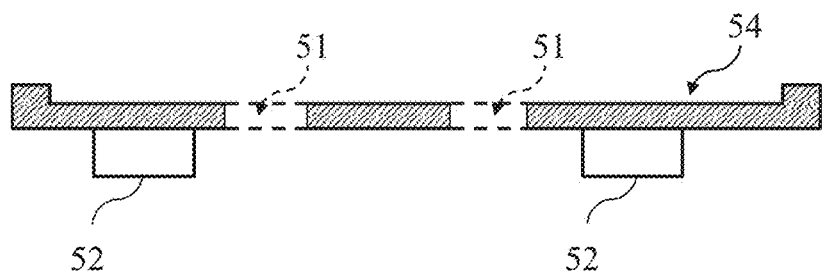
FIG. 2B is a schematic cross-sectional view of the carrier of FIG. 2A taken along a line BB.
Figure 2C:
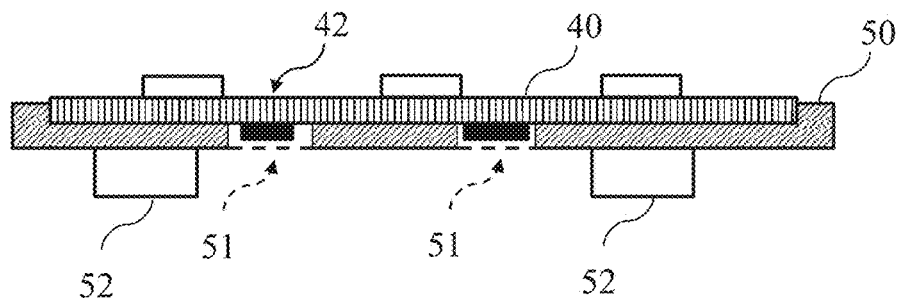
FIG. 2C is a schematic cross-sectional view of the carrier of FIG. 2A carrying and positioning at least one circuit board, according to an embodiment of the present invention.
Figure 4:
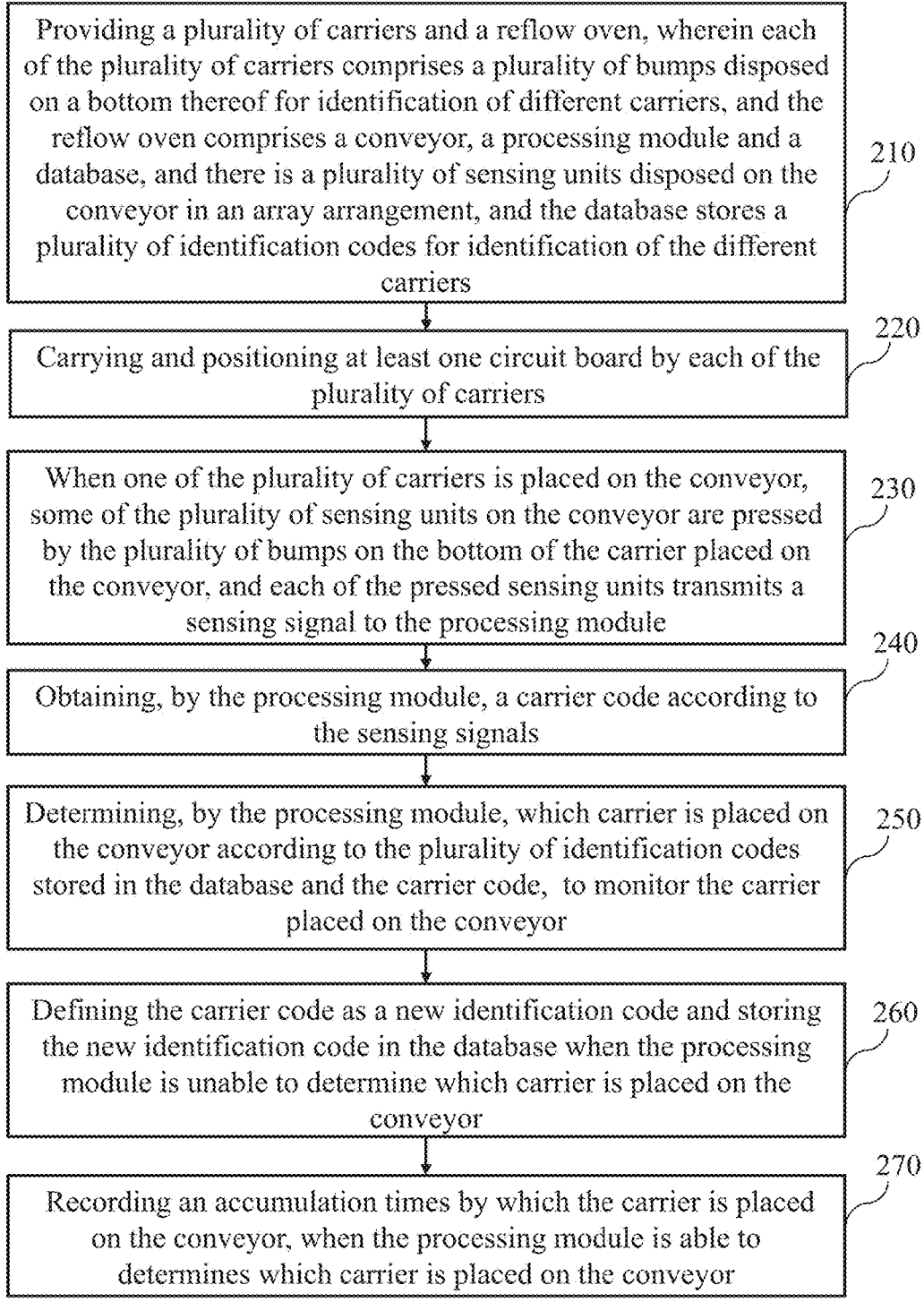
FIG. 4 is a flow chart of a carrier monitoring method performed by the carrier monitoring system of FIG. 1, according to an embodiment of the present invention.

Next, refer to FIG. 4, which is a flow chart of a carrier monitoring method performed by the carrier monitoring system of FIG. 1, according to an embodiment of the present invention. The method comprises steps 210 to 250. In the step 210, a plurality of carriers and a reflow oven is provided, and each of the plurality of carriers comprises a plurality of bumps disposed on a bottom thereof for identification of the different carriers; and, the reflow oven comprises the conveyor, the processing module and the database, and there is a plurality of sensing units disposed on the conveyor in an array arrangement, the database stores a plurality of identification codes for identification of the different carriers. In the step 220, each carrier is used to carry and position at least one circuit board. In the step 230, when one of the plurality of carriers is disposed on the conveyor, some of the plurality of sensing units on the conveyor are pressed by the plurality of bumps on the bottom of the carrier disposed on the conveyor, each of the pressed sensing unit transmits a sensing signal to the processing module. In the step 240, according to the sensing signals, the processing module can obtain a carrier code. In the step 250, according to the plurality of identification codes stored in the database and the carrier code, the processing module can determine which carrier is placed on the conveyor, and further monitor the carrier placed on the conveyor.

Through aforementioned step, when a carrier is placed on the conveyor, the bumps disposed on the bottom of the carrier can press some of the sensing units on the conveyor; and each of the pressed sensing units transmits a sensing signal to the processing module, and according to the sensing signals, the processing module can obtain a carrier code; and, according to the plurality of identification codes stored in the database and the carrier code, the processing module can determine which carrier is placed on the conveyor; and then monitor the carrier entering the reflow oven, so as to achieve the effect of monitoring whether the carrier entering the reflow oven is moved out of the reflow oven normally and facilitate to compute the period where the carrier stays in the reflow oven. The detailed description is illustrated in aforementioned paragraphs, so it is not repeated here.

In this embodiment, the carrier monitoring method may include step 260 and step 270. In the step 260, when the processing module is unable to determine which carrier is placed on the conveyor, the processing module can define the obtained carrier code as a new identification code and store the new identification code in the database. In the step 270, when the processing module is able to determine which carrier is placed on the conveyor, the processing module can record the accumulation times by which the carrier is placed on the conveyor. The detailed description is illustrated in aforementioned paragraphs, so it is not repeated here.

It is appreciated that the steps of the carrier monitoring method can be executed by any sequence unless a cause-effect relation specifically indicated.

To summary, the difference between the technology of the present invention and the conventional technology is that, in the system and the method of the present invention, when the carrier is placed on the conveyor, some sensing units on the conveyor are pressed by a plurality of bumps disposed on the bottom of the carrier, and each of the pressed sensing units transmits a sensing signal to the processing module; and, according to the sensing signals, the processing module can obtain the carrier code; and, according to the plurality of identification codes stored in the database and the carrier code, the processing module can determine which carrier placed on the conveyor. This technical solution can solve the conventional problem, to achieve the technical effect of monitoring the carrier entering the reflow oven.

The present disclosure disclosed herein has been described by means of specific embodiments. However, numerous modifications, variations and enhancements can be made thereto by those skilled in the art without departing from the spirit and scope of the disclosure set forth in the claims.

What is claimed is:

1. A carrier monitoring system, comprising:
a plurality of carriers, each of the plurality of carriers configured to carry and position at least one circuit board, and comprising a plurality of bumps disposed at a bottom thereof for identification of the different carriers; and
a reflow oven comprising a conveyor, a processing module and a database, wherein there is a plurality of sensing units disposed on the conveyor in an array arrangement, the database is configured to store a plurality of identification codes for identification of the different carriers;
wherein when one of the plurality of carriers is placed on the conveyor, some of the plurality of sensing units on the conveyor are pressed by the plurality of bumps of the bottom of the placed carrier, and each of the plurality of pressed sensing units transmits a sensing signal to the processing module, and the processing module obtains a carrier code according to the sensing signals, and the processing module determines which carrier is placed on the conveyor, according to the plurality of identification codes stored in the database and the obtained carrier code, and then monitors the carrier placed on the conveyor.

2. The carrier monitoring system according to claim 1, wherein when the processing module is unable to determine which carrier is placed on the conveyor, the processing modules defines the obtained carrier code as a new identification code, and store the new identification code in the database.

3. The carrier monitoring system according to claim 1, wherein when the processing module is able to determine which carrier is placed on the conveyor, the processing module records an accumulation times by which the carrier is placed on the conveyor.

4. The carrier monitoring system according to claim 1, wherein the material of each of the plurality of carriers is aluminum alloy, magnesium alloy, synthetic stone fiber or glass fiber.

5. The carrier monitoring system according to claim 1, wherein when each of the plurality of carriers carries and positions the at least one circuit board, a printed surface of the at least one circuit board is higher than a highest surface of the carrier corresponding thereto.

6. A carrier monitoring method, comprising:
providing a plurality of carriers and a reflow oven, wherein each of the plurality of carriers comprises a plurality of bumps disposed on a bottom thereof for identification of different carriers, and the reflow oven comprises a conveyor, a processing module and a database, and there is a plurality of sensing units disposed on the conveyor in an array arrangement, the database stores a plurality of identification codes for identification of the different carriers;
carrying and positioning at least one circuit board by each of the plurality of carriers;
when one of the plurality of carriers is placed on the conveyor, some of the plurality of sensing units on the conveyor are pressed by the plurality of bumps on the bottom of the carrier placed on the conveyor, and each of the pressed sensing units transmits a sensing signal to the processing module;
obtaining, by the processing module, a carrier code according to the sensing signals; and
determining, by the processing module, which carrier is placed on the conveyor according to the plurality of identification codes stored in the database and the carrier code; and
monitoring the carrier placed on the conveyor.

7. The carrier monitoring method according to claim 6, further comprising:
defining the carrier code as a new identification code and storing the new identification code in the database when the processing module is unable to determine which carrier is placed on the conveyor.

8. The carrier monitoring method according to claim 6, further comprising:
recording an accumulation times by which the carrier is placed on the conveyor, when the processing module is able to determines which carrier is placed on the conveyor.

9. The carrier monitoring method according to claim 6, wherein the material of each of the plurality of carriers is aluminum alloy, magnesium alloy, synthetic stone fiber or glass fiber.

10. The carrier monitoring method according to claim 6, wherein when the at least one circuit board is carried and positioned on each of the plurality of carriers, a printed surface of the at least one circuit board is higher than a highest surface of the carrier corresponding thereto.

* * * * *